(12) United States Patent
Deame et al.

(10) Patent No.: US 10,353,709 B2
(45) Date of Patent: Jul. 16, 2019

(54) DIGITAL SIGNAL PROCESSING ARRAY USING INTEGRATED PROCESSING ELEMENTS

(71) Applicant: Nextera Video, Inc., El Dorado Hills, CA (US)

(72) Inventors: John E. Deame, El Dorado Hills, CA (US); Steven Kaufmann, Rockledge, FL (US); Liviu Voicu, Winter Springs, FL (US)

(73) Assignee: Nextera Video, Inc., El Dorado Hills, CA (US)

( * ) Notice: Subject to any disclaimer, the term of this patent is extended or adjusted under 35 U.S.C. 154(b) by 128 days.

(21) Appl. No.: 15/703,677

(22) Filed: Sep. 13, 2017

(65) Prior Publication Data

US 2019/0079761 A1    Mar. 14, 2019

(51) Int. Cl.
*G06F 15/167* (2006.01)
*G06F 9/54* (2006.01)
*G06F 9/30* (2018.01)
*G06F 15/80* (2006.01)

(52) U.S. Cl.
CPC .......... *G06F 9/3005* (2013.01); *G06F 9/3004* (2013.01); *G06F 15/80* (2013.01)

(58) Field of Classification Search
None
See application file for complete search history.

(56) References Cited

U.S. PATENT DOCUMENTS

| | | | |
|---|---|---|---|
| 10,031,733 B2 * | 7/2018 | Vorbach | G06F 8/45 |
| 2006/0008180 A1 * | 1/2006 | Wakeland | G06F 9/3851 |
| | | | 382/303 |
| 2014/0297948 A1 * | 10/2014 | Vorbach | G06F 8/45 |
| | | | 711/114 |

\* cited by examiner

*Primary Examiner* — Hyun Nam
(74) *Attorney, Agent, or Firm* — Kwan & Olynick LLP

(57) ABSTRACT

Techniques and mechanisms described herein include a signal processor implemented as an overlay on a field-programmable gate array (FPGA) device that utilizes special purpose, hardened intellectual property (IP) modules such as memory blocks and digital signal processing (DSP) cores. A Processing Element (PE) is built from one or more DSP cores connected to additional logic. Interconnected as an array, the PEs may operate in a computational model such as Single Instruction-Multiple Thread (SIMT). A software hierarchy is described that transforms the SIMT array into an effective signal processor.

20 Claims, 13 Drawing Sheets

DIGITAL SIGNAL PROCESSING ARRAY USING INTEGRATED PROCESSING ELEMENTS

TECHNICAL FIELD

The present disclosure relates generally to the configuration of computer processors, and more specifically to the configuration of field programmable gate arrays and application specific integrated circuits for the parallel processing of digital signals.

DESCRIPTION OF RELATED ART

In recent years, field programmable gate arrays (FPGAs) have emerged as a power-efficient alternative to graphics processing units (GPUs) and multiple-core central processing units (CPUs) for the implementation of complex algorithms in real-time or near real-time applications. In its 2015 investor meeting, Intel estimated that FPGAs will be used in 30% of data center servers by 2020. The main drawback to using FPGAs has been the difficulty involved in designing complex logic with basic hardware description languages (HDL) and the slow and laborious cycle between design and testing. The introduction of high-level synthesis (HLS) has somewhat mitigated these challenges, but the issues of long synthesis, long place and route times, and cryptic, machine-generated code still remain.

One approach to avoiding cryptic code and time-consuming development cycles is to use an overlay. Overlay architectures isolate the user even further from the complexity of FPGA synthesis and effectively transform an FPGA implementation into a software production enterprise. Effective computing platforms have been obtained by replicating simple processing elements (PEs) in the FPGA fabric and providing an instruction stream to enable the PEs to operate in a single instruction multiple data (SIMD) configuration.

One example of such an approach is the soft-core processor Octavo, which has been used as a building block for a replicated, point-to-point mesh of PEs (fine grained). Further enhancements to this architecture use hardened DSP's in the FPGA as co-processors to increase computational performance (coarse grained).

More recent representative examples of coarse-grained FPGA overlays include iDEA, FSE, DeCO, and IPPro. These processors include PEs based on Xilinx DSP cores and are designed to connect with each other and form arrays capable of limited SIMD parallelism. However, due to their costly connection and data alignment logic requirements, a typical array implemented in FPGA is unable to use a large percentage of the FPGA DSP resources available and typically does not exceed a modest number of PEs, such as 16. Oftentimes, these arrays are interconnected in a manner so that they fit a predefined algorithmic dataflow, which requires specifying priority and providing individualized instruction sequences. They are architected based on the reduced instruction set computer (RISC) model, with a reduced set of short instructions. Finally, in these architectures, each PE is designed to process a single element of a (wide) data vector at a time (thus the term of vector overlays).

To date, all of these implementations have remained inadequate for many challenging applications such as real-time, large-format video processing due to limitations in processing and I/O performance resulting from the array architecture and the addition of programmability. Hence, none of these implementations have achieved widespread commercial success. Accordingly, improved techniques for providing efficient signal processing are desired.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

Various embodiments of the present invention relate generally to devices, systems, and methods for the performance of digital signal processing. According to particular embodiments, a data processing system may include a plurality of processing elements. Each processing element may be an internal hardened field-programmable gate array digital signal processor or an internal application-specific integrated circuit digital signal processor. Each processing element may also include an internal hardened field-programmable gate array memory element, application-specific integrated circuit memory element, or other memory element. The data processing system may also include a plurality of connections between the processing elements, where each digital signal processor can directly access the memory element of at least one other digital signal processor.

In some embodiments, each of the processing elements is configured to execute one or more instructions received from a designated source based on an internal state associated with the processing element. Alternately, or additionally, each of the processing elements is configured to receive instructions broadcast from a designated source.

In some implementations, the processing elements are arranged in a one-dimensional or two-dimensional grid such that each processing element is contiguous with one or more other processing elements. Each processing element in the grid can directly access the memory element of associated contiguous processing elements. In particular embodiments, data stored in each memory element can be accessed in a single clock cycle.

In some embodiments, each processing element includes an arithmetic logic unit configured to execute arithmetic and bitwise logical operators. The data processing system may be configured to process input data arranged in an array, and each processing element may receive a respective sub-array of the input data.

In particular embodiments, the processing elements are arranged in a grid having a first dimension and a second dimension, where the length of the grid along the second dimension is greater than the length of the grid along the first dimension, and where the processing elements are configured to receive input data along the length of the second dimension in order to minimize or eliminate redundant processing. In some configurations, the length of the first dimension is one processing element. Additionally, data input and output to the local register file is implemented as a ring buffer. The processing elements may be arranged so as to eliminate redundancy in processing data along the first and/or second dimension.

According to various embodiments, the processing elements may be arranged in a grid having a first dimension and a second dimension. In such embodiments, a length of the grid along the second dimension may be greater than a length of the grid along the first dimension. The processing elements may be configured to receive input data along the length of the second dimension in order to minimize or eliminate redundant processing. The data processing system may be configured to process input data arranged in an array, and each processing element may be configured to receive a respective sub-array of the input data. The processing elements may be arranged so as to eliminate redundancy in processing data along the second dimension.

According to various embodiments, the processing elements are arranged in a grid having a first dimension and a second dimension. In such embodiments, a length of the grid along the second dimension may be greater than a length of the grid along the first dimension. The processing elements may be configured to receive input data along the length of the second dimension in order to minimize or eliminate redundant processing. Data input and output t to the local register file may be implemented as a ring buffer, and the processing elements may be arranged so as to eliminate redundancy in processing data along the first dimension.

In particular embodiments, each of the processing elements is configured to execute one or more instructions from a designated source, and the execution of the instructions employs data included in the instructions.

These and other embodiments are described further below with reference to the figures.

BRIEF DESCRIPTION OF THE DRAWINGS

The disclosure may best be understood by reference to the following description taken in conjunction with the accompanying drawings, which illustrate particular embodiments of the present invention.

DESCRIPTION OF EXAMPLE EMBODIMENTS

Figure 1:
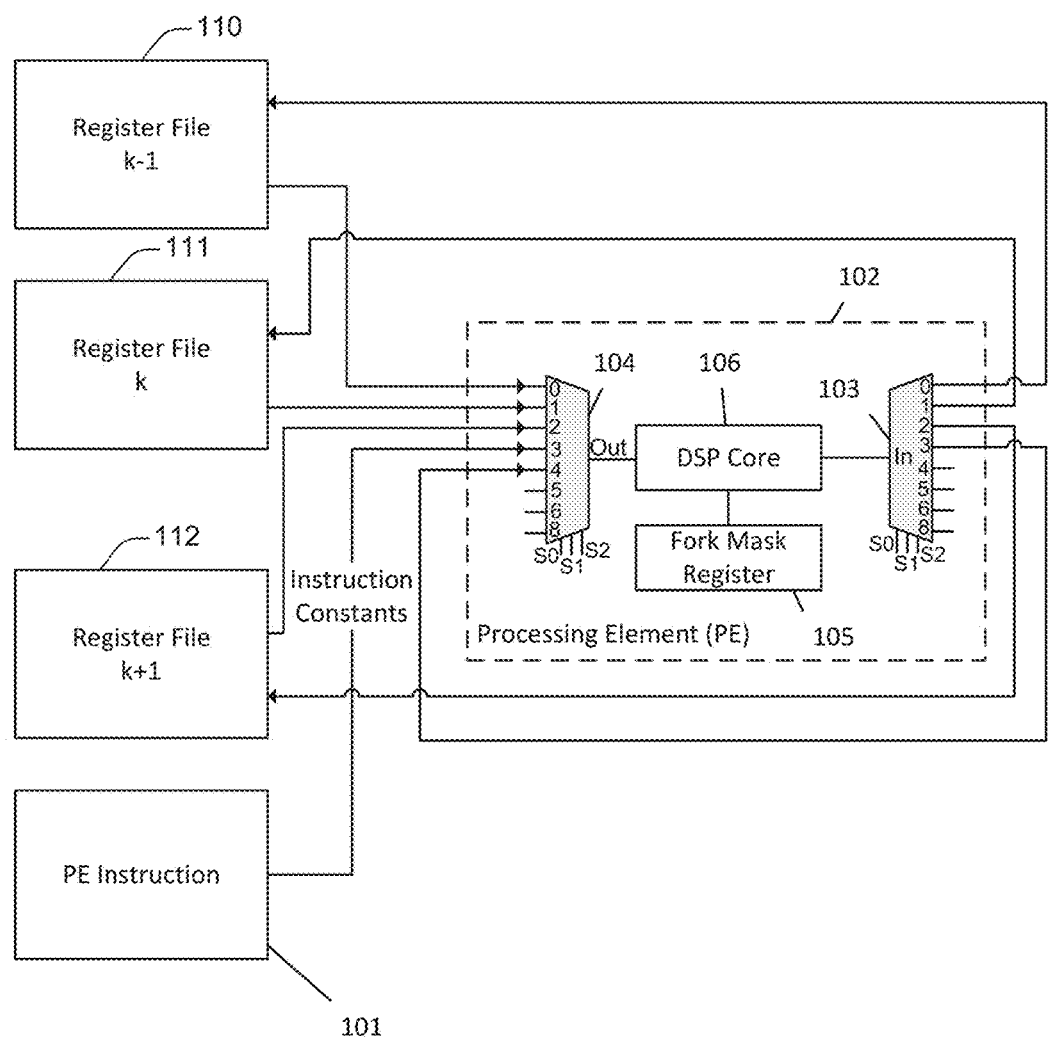
FIG. 1 illustrates a processing element that includes a single hardened digital signal processing core, configured in accordance with one or more embodiments.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of particular architectures and methods. However, it should be noted that the techniques of the present invention apply to a wide variety of different techniques and mechanisms. In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Overview

The present application describes a novel general-purpose signal processor that utilizes a combination of programmable logic and dedicated logic such as memory blocks and Digital Signal Processing (DSP) blocks available in certain Field Programmable Gate Arrays (FPGAs) devices. Techniques and mechanisms described herein are also applicable to application specific integrated circuits (ASICs).

Example Embodiments

According to various embodiments, techniques and mechanisms described herein include a new, high level language programmable processing architecture with significant input/output and computational advantages without the limitations of conventional FPGA overlays. In some embodiments, this architecture includes arrays of hardened DSP cores and register files interspersed with generic logic elements (LEs) and interconnected in a single or bi-dimensional lattice. The processor also includes auxiliary logic modules, which include components such as an instruction sequencer, an external I/O controller module, mask registers for conditional execution, and LEs for data pathway selection.

In some embodiments, techniques and mechanisms described herein also include a highly efficient, FPGA-based signal processing overlay that addresses limitations of conventional vector overlay approaches. This new architecture may be referred to herein as a tile overlay, while a processor that reflects this architecture may be referred to as a tile overlay processor (TOP). The TOP differs from the vector overlay by arranging the data such that a one-dimensional or bi-dimensional sub-array of data objects, pixels for instance, is assigned to each PE. This is in contrast to the traditional 2D vector overlay approach of assigning a single data object to each PE and processing array-sized blocks of data into the array sequentially. Tile sizes may be application and algorithm specific and may be tailored to the size of the array, the size of the operator, and the size of the data set. The tile size may be changed dynamically to accommodate processing data set sizes, for instance high definition (HD), 4 k, and 8 k video or image data with the same array.

According to various embodiments, one or more techniques and mechanisms described herein involve aligning the dimensions of an array of PEs to the size of at least one dimension of the data set, such as, for example, the width of a video line. The one-dimensional embodiment of a PE array may be referred to herein as a Row of PEs (ROPE). In a different embodiment, suitable for applications such as vertically oriented operations, the PE array may be arranged in a vertically-adjacent fashion, which may be referred to herein as a Column of PEs (COPE). In yet another embodiment, a ROPE/COPE structure (hereafter called ROPE for simplicity) may contain a plurality of rows/columns of data given available FPGA resources.

In some implementations, once synthesized, the architecture described herein can execute instruction sequences produced by a compiler or code generator from a high-level language such as C. Techniques and mechanisms described herein allow developers to deploy highly complex algorithms on FPGA devices with a turnaround time comparable to that of software implementations and performance comparable to that of hardware description language (HDL) implementations.

According to various embodiments, any or all of the techniques and mechanisms described herein may be implemented via ASICs instead of, or in conjunction with, FPGAs. In particular, the techniques that may be implemented via ASICs may include, but are not limited to: the TOP architecture, the ROPE architecture, the COPE architecture, the "Line-in, Line-out" architecture, and any architecture in which custom DSPs are capable of accessing the memory of neighboring DSPs.

Overlap Penalty

Conventional vector overlay techniques typically impose the drawback of an overlap penalty. That is, vector overlay arrays of PEs which are small relative to the size of the data object, for instance a video image, are inefficient when performing neighborhood operations such as convolutions because data must be duplicated around the edge of the array-sized subframe to prevent edge effects. A subframe is hereby defined as a contiguous plurality of pixels loaded into the array for concurrent processing. This inefficiency can increase the processing time by 2× to 10× for large data sets such as 4 k images.

The overlap penalty is incurred when a large, contiguous data block such as an image is distributed for processing among a plurality of processing units (array of PEs), so that the array is allocated contiguous subsets (or subframes, in the case of images) of the original block, one at a time, until the entire data block is processed. For certain operators where a resulting datum (e.g., a pixel) is obtained by combining a contiguous plurality of the original data (e.g., pixels), artifacts called edge-effects are produced at the borders between the subframes.

Figure 12A:
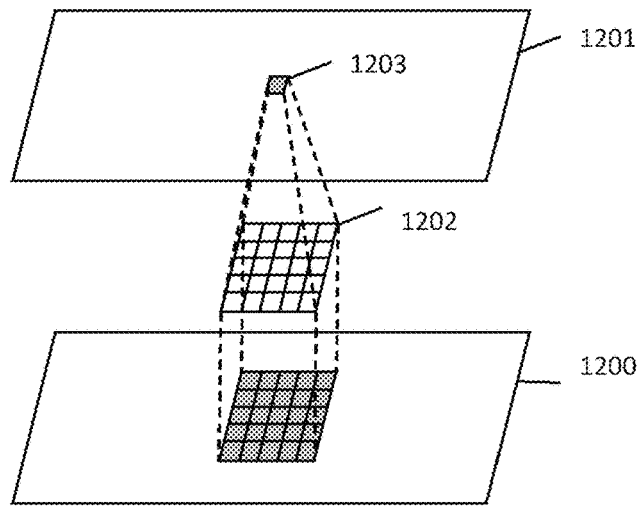
FIGS. 12A and 12B illustrate examples of the mechanism of the convolution operator and the incurred edge effects.
Figure 12B:
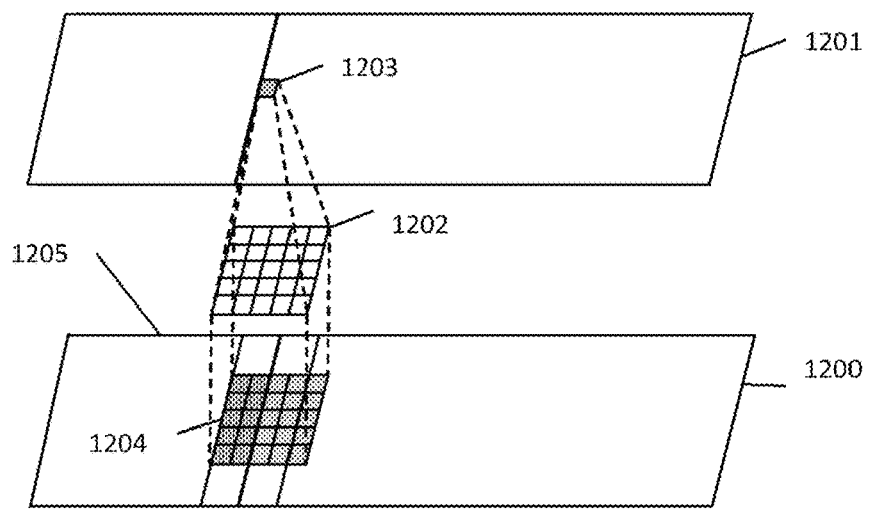

FIG. 12A illustrates an example of such operator, extremely common in image processing, called a convolution. When executing a convolution, a neighborhood of pixels from the original subframe (1200) are multiplied with coefficients from a kernel (1202) and the results summed up to obtain a single pixel (1203) in the processed subframe (1201). The mechanism illustrated in FIG. 12 (a) is repeated for every pixel of the processed subframe. Edge effects are occurring when the processed pixel is close to the border of the subframe, as illustrated in FIG. 12 (b). The projection of the kernel onto the original subframe will now extend beyond the edge of the subframe and include a neighborhood of pixels (1204) that actually belong to the adjacent (subsequent) subframe (1205) and are not currently available to the array of processors.

In order to ensure the availability of these pixels to the processing unit assigned to subframe (1200), a certain overlap between subframes (1200) and (1205) must be considered. This overlap includes the adjacent bands (1206), which both have a width equal to the half the width of the largest operator in the process. A more detailed description of a procedure used to calculate the necessary number of overlapping pixels is provided in the section dedicated to the Image Data Flow. An overlap between adjacent subframes leads to inefficiencies, as the pixels in the overlapped areas must be replicated, and processed, in both subframes. When the operators are large relative to the array size this can add significant overhead, dramatically reducing the efficiency of the array.

According to various embodiments, techniques and mechanisms described herein such as the TOP overcome this inefficiency. In a TOP, the subframe size associated to each ROPE may be specified to match the width of the data set. More specifically, to process an image of width W, one embodiment will comprise a certain number of PEs (n), each with a certain tile width (w), such that n×w=W. In addition, each PE can access each of its neighbors' register file, which eliminates the need for redundant data in each PE's register file. These adaptations, combined with the "Line-in, Line-out" data flow model described herein, effectively eliminate the need for array subframe overlap in any dimension and dramatically increase the performance of the overlay. For example, the performance of the overlay may be increased by a factor of 2, 10, or more relative to conventional techniques and depending on factors such as the operator size and array size relative to the data set size. A TOP approach also allows very small arrays to operate on very large data sets. For example, in some embodiments a small, inexpensive FPGA may perform significant processing on a 60 frame per second, 4 k or 8 k image stream. Such performance had not been possible with prior overlays.

Shift Penalty

Conventional vector overlay techniques typically impose the drawback of a shift penalty. At any given time, a PE in a conventional vector overlay has access to a very small number of neighboring data, such as the four nearest neighbor pixels. As a consequence, for topologically large operators, such as large convolutions, the array must execute a multitude of data transfers (shifts) between adjacent PEs, which increase significantly the overall processing time.

According to various embodiments, techniques and mechanisms described herein such as the TOP reduce or eliminate the shift penalty since each PE contains all of the neighboring data objects it needs per the tile definition. In addition, in embodiments where each PE has access to its east and west neighbor memories, the reach of each PE is tripled. Each subsequent neighbor connected to the PE multiplies the data reach by the size of the tile reducing or eliminating the need for costly data shifts in the array. For instance, in some embodiments a PE may have immediate access to 256×256 or more data elements.

Integer Normalization Penalty

Conventional vector overlay techniques typically impose the drawback of an integer normalization penalty. Vector overlays often include integer multipliers, adders, and arithmetic-logic units (ALUs) and, consequently, can only operate in fixed-point arithmetic. In fixed-point arithmetic, a multiplicative scale factor must be introduced to mitigate accuracy limitations, especially when small numbers are involved. This scale factor must then be factored out of the result, in an operation called normalization, which adds inefficiency in processing.

According to various embodiments, techniques and mechanisms described herein such as the TOP can avoid normalization through costly shift registers or additional data passes through the PE by custom pre-scaling the coefficients in the instruction word. These advantages may be provided even when the TOP is implemented as an integer processing machine that operates in fixed-point arithmetic. The scale factor may be chosen so that the most significant bit of the output data is aligned to a predefined bit in the output port of the PE. In this manner, the normalization of the result is executed by discarding the appropriate number of least significant bits in the output bus. Such an approach may be implemented at zero hardware cost and may enable scaling to very large arrays.

Input/Output Inefficiency

Conventional vector overlay techniques typically impose the drawback of I/O Inefficiency. In most parallel processors, the required data transfers (I/O) from the external memory into the internal/local memory is more time consuming than the computational process itself. In these processors, the challenge is in being able to execute the I/O within the required time constraints, rather than in the data processing. Such processors may be referred to as I/O limited, as opposed to compute limited.

According to various embodiments, techniques and mechanisms described herein such as the TOP are optimized for I/O in a multitude of aspects. First, the "Line-in, Line-out" approach may store the I/O data in the register file configured as a ring buffer, eliminating vertical overlap and eliminating redundant I/O. In addition, this approach may load only the data needed to begin the operation rather than all of the data required for the entire operation. The ROPE approach may reduce or eliminate processing overlap, which avoids processing of replicated pixels. This reduces or eliminates I/O redundancy, which can limit the overall performance of the processor. Second, each PE has access to its neighbors' memory, reducing or eliminating the need for data movement between PEs. Third, data are efficiently inserted into or extracted from the array in either a local or global manner with minimal overhead, as described in a later paragraph. Finally, the instruction sequencer is designed to flag the particular instructions during which the pipeline through the PE is stalled, or which comprise cycles with no memory access. During these cycles, the instruction sequencer may schedule external I/O operations in preparation of future processing. These external I/O operations, scheduled while the processing is still ongoing in the PE, are called concurrent I/O and may contribute to a significant increase of processing efficiency, especially in processors or applications that are I/O limited.

Processing Element (PE)

General Description

According to various embodiments, the architecture may include a single or a bi-dimensional array of Processing Elements (PEs). Each of the PEs comprise one or more hardened DSP cores, or slices, such as the DSP48E1 and the DSP48E2 available in Xilinx Ultrascale and Ultrascale+ devices. Each PE is connected to a high speed register file, constructed from internal memory blocks, often called Block RAM or Ultra RAM. For example, in certain Ultrascale and Ultrascale+ devices, this memory consists of blocks of 4,096 72-bit words, each of which can be divided into 18-bit wide segments to support 4 PE's. The invention is not limited to Xilinx devices and can be applied to, for example, Altera/Intel devices with DSP IP cores. One example of such a device is Arria 10, where a floating-point DSP core is available.

In particular embodiments, the term register file may refer to a type of memory accessible in a single clock cycle. In some implementations, a different type of memory block may be employed in place of a register file, such as a memory block accessible in two or more cycles.

A single-core PE embodiment (102) is illustrated in FIG. 1. In a single dimensional array, a PE, labeled, for example, PE k, may access three register files: its own, labeled k (111), and those of its immediate neighbors, labeled k−1 (110) and k+1 (112), respectively. Auxiliary logic (103, 104) is added to assist in selecting the data pathways in and out of the PE. The PE instruction sequencer (101) isolates the constants from the instruction stream and delivers them to each of the PE inputs. The embodiment shown in FIG. 1 includes a fork mask register (105) that masks data outputs for conditional execution (forks), which differentiates the SIMT architecture shown in FIG. 1 from a conventional SIMD architecture.

In some implementations, the PEs may be arranged in a bi-dimensional array, and the connectivities among neighboring PEs may change relative to a single-dimensional array implementation. For example, one PE may access the register files of its east, west, north, south, and diagonal neighbors, besides its own register file. The techniques and mechanisms described herein covers both topologies (single-dimensional and bi-dimensional arrays), which are discussed herein.

Figure 2:
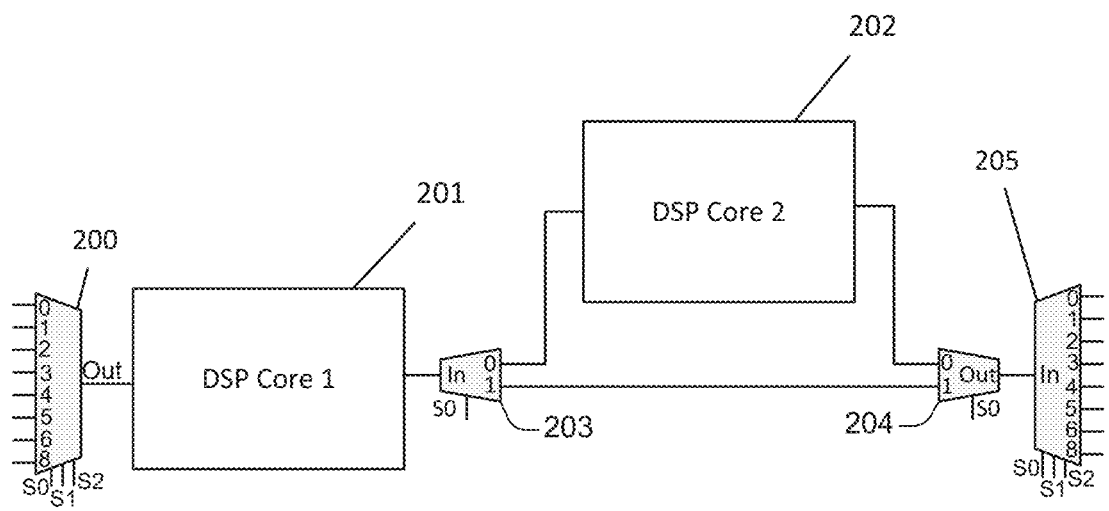
FIG. 2 illustrates a processing element that includes two hardened digital signal processing cores, configured in accordance with one or more embodiments.

In some embodiments, a PE may comprise two DSP cores, as illustrated in FIG. 2. In the embodiment shown in FIG. 2, the input and output selection logic (200, 205) is still present. The two DSP cores (201 and 202) are separated by selection logic (203, 204), which allows for the dynamic selection of the first DSP core (201) as a standalone unit, or of both DSP cores in cascade. This configuration allows for a greater flexibility and faster speed. It also alleviates the I/O traffic between the PE and local register files, but, on the other hand, it reduces the total possible number of available PEs by 50% and, consequently, the size of the SIMT array. The decision to use single or dual core PEs depends on factors that may include, but are not limited to: the FPGA device family, the configuration of the available internal memory, the type of operators that must be supported, and the necessary execution speed. For example, a Xilinx DSP48E2 core can execute a Multiply-Accumulate (MAC) operation in one clock, but not an Absolute Difference (AD). The addition of a second DSP48E2 core would ensure that an AD can also execute in a single clock. On the other hand, on an Altera/Intel Arria 10 native fixed point DSP core, an AD does execute in a single clock.

In some embodiments, a PE may include three or more DSPs. For example, such a configuration may be desirable when performing calculations of increased complexity. In typical FPGA devices, DSP slices are cascadable through high speed data buses which may or may not be used in configuring a PE. In general, the techniques and mechanisms described herein are generally applicable to a variety of complex PE architectures, such as those including three or more PEs.

Internal PE Architecture

Figure 3:
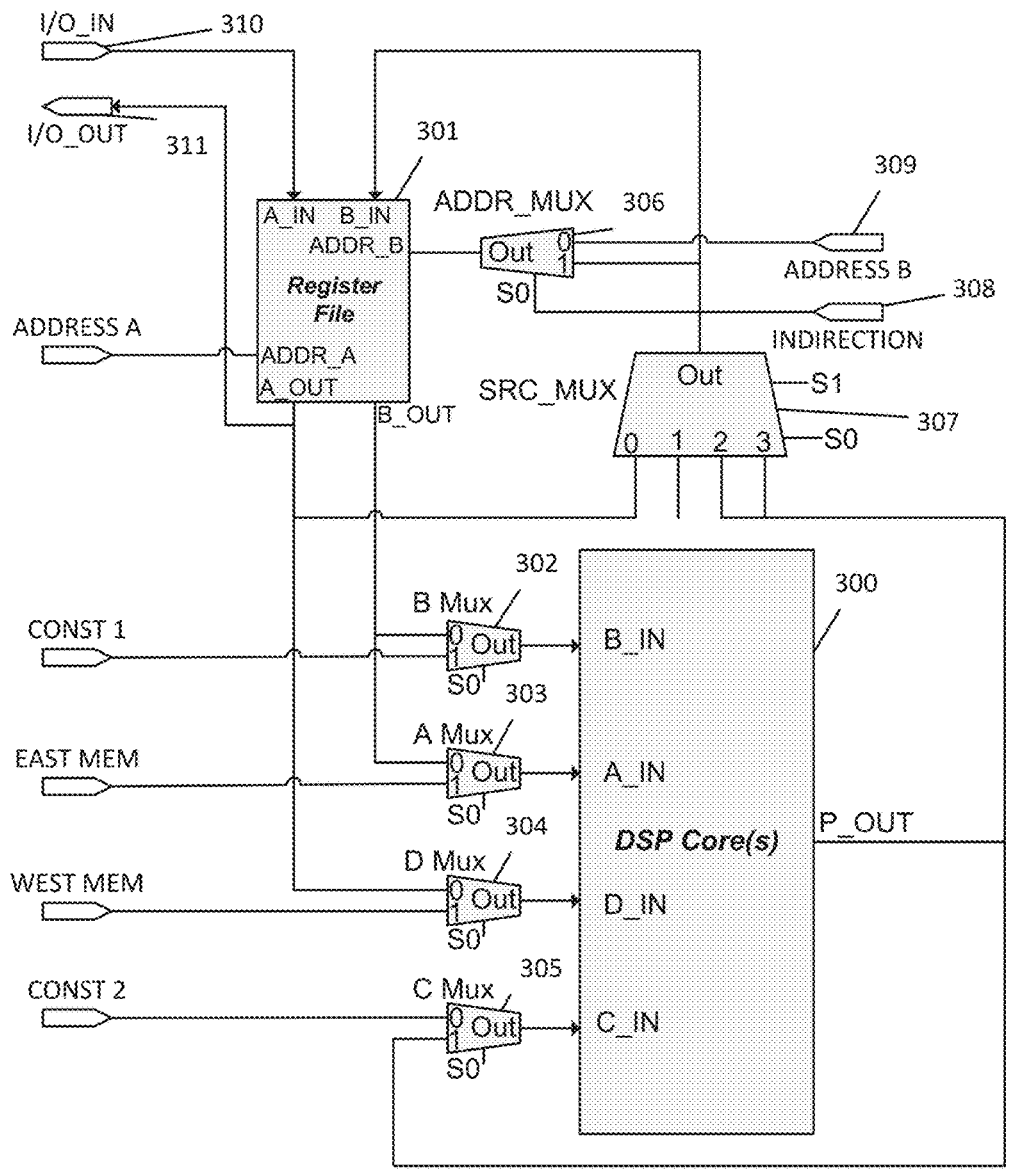
FIG. 3 illustrates an example of a configuration of a processing element interface, arranged in accordance with one or more embodiments.

The block diagrams illustrated in FIGS. 1 and 2 show a Processing Element (PE) that includes one or two hardened DSP slices and a register file configured from block RAM or Ultra RAM memory generally available on most FPGA devices. In FIG. 3, a more detailed representation of a PE is provided in accordance with one or more embodiments. In particular, FIG. 3 illustrates internal connections that may exist within the PE.

The central part of the PE is the DSP core (300), which may include one, two, or more hardened DSP cores. Detailed in FIG. 3 is a breakdown of the connections attached to the multiple inputs that may be available in a DSP core. The 4 input ports shown in FIG. 3, namely, A_IN, B_IN, C_IN, and D_IN, respectively, are present in a Xilinx DSP48E DSP slice, but the techniques and mechanisms described herein may be applied to any suitable DSP cores. For example, the same design could apply to an Altera/Intel Arria 10 device, where a number of up to 6 different input ports, namely dataa_x0, dataa_v0, dataa_z0, and datab_x1, datab_y1, and datab_z1 are available, depending on the configuration. The PE also includes a Register File (301).

In particular embodiments, the techniques and mechanisms shown in FIG. 3 are applicable to a structure called a row of PEs (ROPE), which is a single-dimensional SIMT array where every PE can access its own register file, as well as the register files of two neighbor PEs, referred to as "East" and "West." These connections are available on ports A and D, respectively, through multiplexers A Mux (303) and D Mux (304), respectively. In this embodiment, ports A and D can also receive input from local memory ports A_OUT and B_OUT, respectively. In addition, a constant that may be retrieved directly from the instruction by an instruction parser and decoder module is transmitted to port B_IN through input multiplexer B_MUX (302). The remaining input port, C_IN, is connected to another constant from the instruction stream via the C_MUX (305), or to the DSP output, P_OUT, to provide a feedback loop in a multi-pass operator.

The connections shown in FIG. 3 have been configured in such a way so as to facilitate the basic operator of convolution with symmetric coefficients. In one configuration, ports A and D are inputs into a pre-adder block, whereas port B leads directly to the multiplier immediately downstream from the pre-adder. Two independent pixels may be loaded from the memory concurrently on A_IN and D_IN, then added together in the pre-adder, and finally, multiplied with the filter coefficient B_IN they both share through symmetry.

Using this strategy, two multiply/accumulate (MAC) operators may be executed in a single clock for a symmetric filter. Such a structure may be employed in Xilinx devices, Altera/Intel devices, or other suitable DSP cores.

A PE can be configured in a different manner than the one shown in FIG. 3. For example, other configurations may be employed depending on factors such as the application at hand and the available resources on the FPGA device.

In the embodiment in FIG. 3, the I/O_IN (310) and I/O_OUT (311) lines have been explicitly represented to show an embodiment of the external I/O logic attached to each PE. The external I/O logic creates the interface between an I/O Controller and the local register files, and serves as a platform for data transfer between an external memory, or data stream, and the local PE memories. The present invention does not, in any way, require that the external I/O be supported by the A_IN ports and A_OUT ports, exclusively. A port allocation different from the examples discussed here is well within the scope of the techniques and mechanisms described herein.

Also represented in FIG. 3 is an embodiment of the mechanism through which the PE stores a result into the register file. In this embodiment, the multiplexer SRC_MUX (307) selects the source of the datum to be stored, which may come from the DSP output (P_OUT), or another register file output such as A_OUT.

If the datum to be stored comes from a register file output, the PE is said to be capable of direct memory loopback. Through a direct memory loopback, the PE can efficiently move a datum from one register file location to another without having to pipeline it through the DSP core. In the embodiment shown in FIG. 3, the datum is read through register file port A_OUT and transmitted through SRC_MUX to the B_IN port. The direct memory loopback facilitates increased efficiency because it may be conducted concurrently with other operators that execute on the DSP core. In different PE embodiments, other ports may be used to implement the direct memory loopback capability.

If the datum to be stored into the register file comes from the DSP output (P_OUT), then one must contend with an important limitation of the typical DSP cores available in FPGA devices. Specifically, the width of the local memory words in both Xilinx and Altera/Intel FPGA devices is typically programmable, but is limited in comparison to the common output width of an embedded DSP core. For example, a block RAM module in a Xilinx device is 18-bits wide, but a Xilinx DSP slice can output results with 48 bits of precision. An M20K memory block in an Altera/Intel device is typically 20-bits wide, but the Altera/Intel DSP core can provide 64 bits of precision. In order to circumvent this mismatch and increase the computational precision of the PE array, a multi-cycle register file access is implemented in the PE. In some embodiments, the multi-cycle access may be implemented by splitting the output line in two equal widths and feeding them into separate inputs (2 and 3, in FIG. 3) of the SRC_MUX (307). The memory store operation will be performed in two cycles, one per each multiplexer input.

Another meaningful capability of the PE made possible by embodiment shown in FIG. 3 is the indirect addressing capability. In the embodiment from FIG. 3, the address for register file port B may be provided either explicitly, in the instruction (309), or by the DSP unit itself, as a result of a prior computation. This latter scenario may be selected through the indirection bit (308), which is also provided in the instruction. A common application that will be significantly expedited by indirect addressing is a Look-Up-Table (LUT). A LUT is an example of content addressable memory where every input is mapped into a different output based on a transformation function defined synthetically, point-by-point. In image processing, many enhancement techniques, such as, for example, fixed and adaptive contrast and brightness enhancements, may be implemented through a LUT. In order to implement a LUT, a certain area in the memory will be allocated for storing the LUT transformation. Then, the DSP core will compute the input value into the LUT and send it to ADDR_B port of the local register file through the SRC_MUX and ADDR_MUX (306). The selection bit of ADDR_MUX will be set to 1 by the INDIRECTION (308) bit provided by the instruction.

It is important to emphasize that most DSP cores in an FPGA device are designed to be interfaced efficiently with one another, in order to support processing of wider data elements or cascading operations. The interface between two DSP cores described herein may, or may not use the interface signals provided by the FPGA manufacturer.

Single Instruction-Multiple Thread (SIMT) Array of PEs

Figure 4:
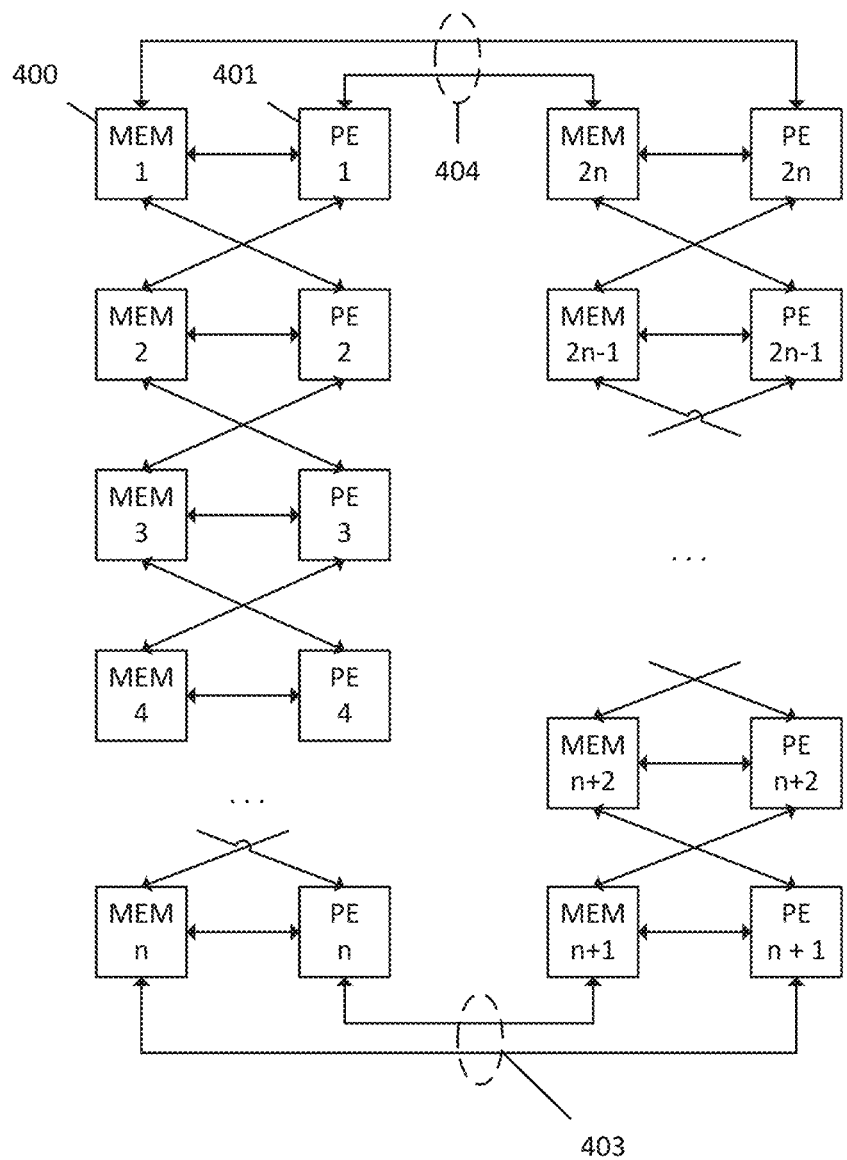
FIG. 4 illustrates a single dimensional array of processing elements, which may be referred to herein as a row of processing elements ("ROPE"), configured in accordance with one or more embodiments.

According to various embodiments, by interconnecting multiple PEs in a single or bi-dimensional array, a highly parallel processor may be synthesized. A single-dimensional embodiment of such an array is illustrated in FIG. 4, where a number of 2n PEs (401) and register files (400) are chained together in a ROPE. In this embodiment of a ROPE, PE number k has access to register files k, k−1, and k+1, as shown in FIG. 1. A ROPE also has the advantage that it can be synthesized with minimal routing because the topology of the architecture follows the physical column-based layout of the DSP cores and register files in most FPGA devices. The particular ROPE embodiment depicted in FIG. 4 includes the wraparound connections (403) and (404), which ensure that arrays of data stored in the register files 1 to 2n can undergo rotation with wraparound.

Figure 5:
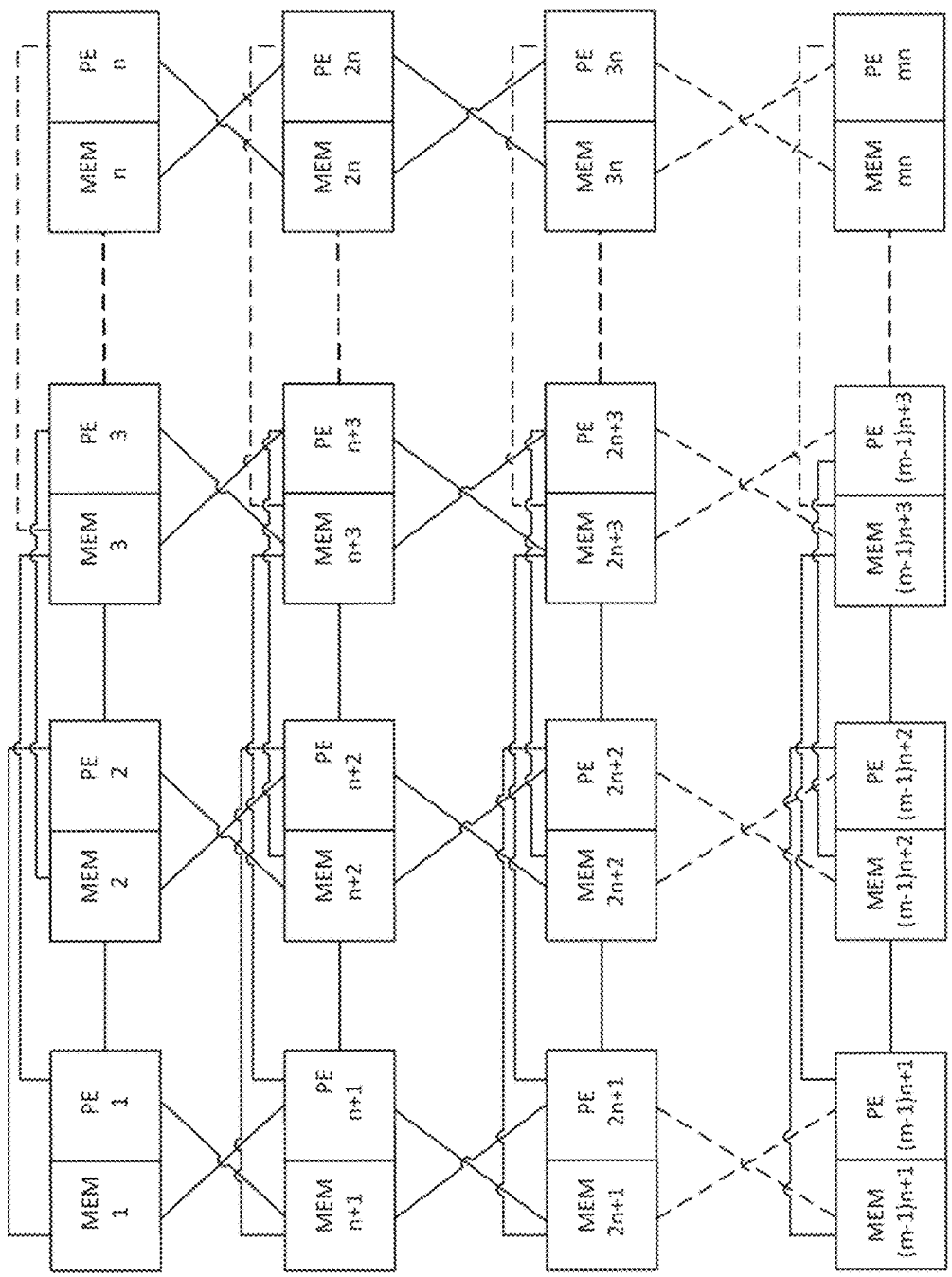
FIG. 5 illustrates a bi-dimensional array of processing elements configured in accordance with one or more embodiments.

In some embodiments, for applications such as 4 k or 8 k video processing, a bi-dimensional mesh embodiment may be a higher performing array configuration, particularly if there are a large number of DSPs available in the device. FIG. 5 shows a bi-dimensional, m×n PE array. A bi-dimensional array requires additional multiplexer resources and may be harder to route on the device because each PE nominally has access to five register files, namely, its own, and those attached to its north, south, east, and west neighbors. Wider multiplexers may be employed to provide access to neighbors up to n PE's away in either direction, or diagonally. In both single-dimensional and multi-dimensional meshes, connection resources may be reduced significantly by serializing the connections between PE's.

Figure 6:
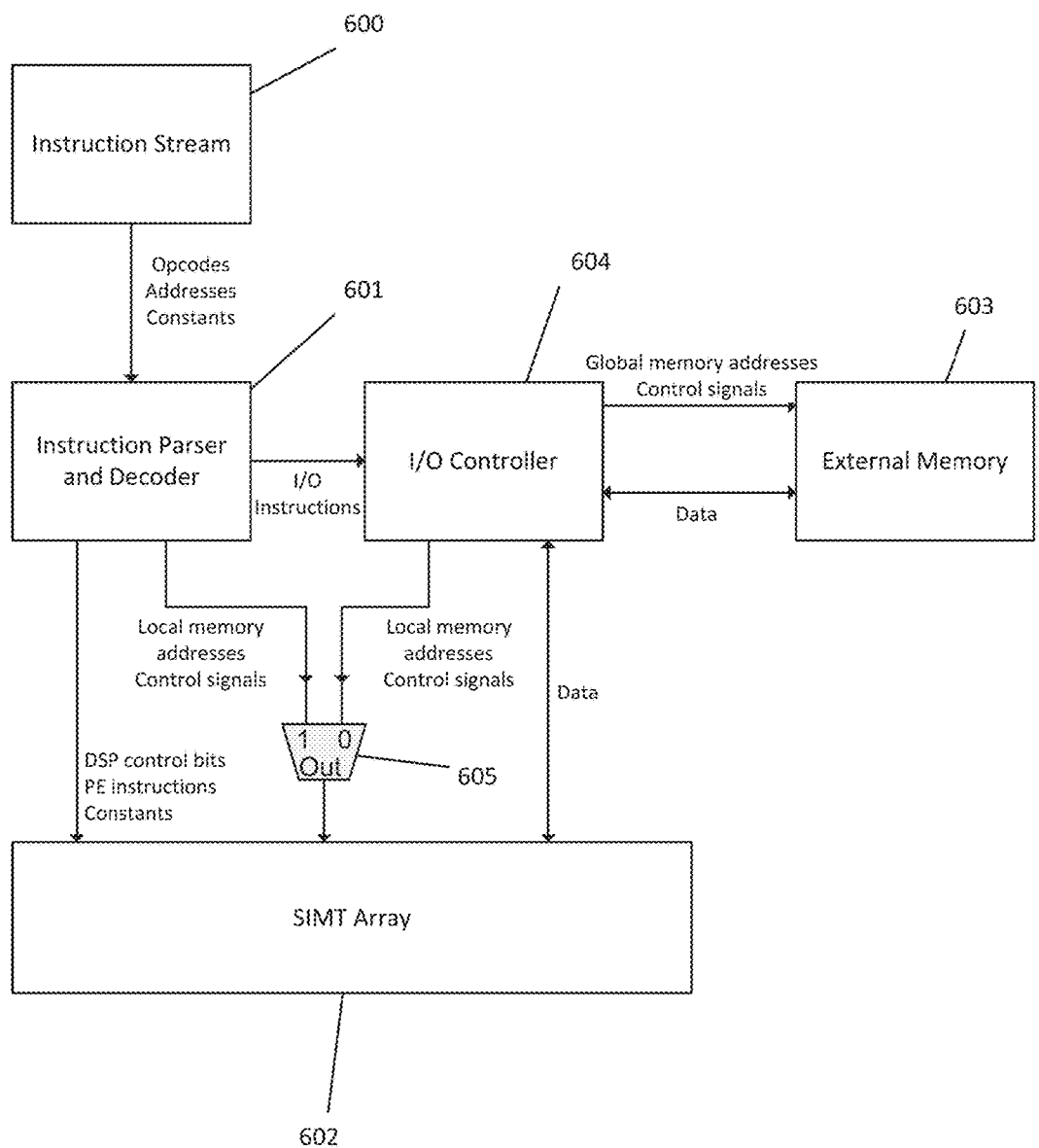
FIG. 6 illustrates the general architecture of a signal processor, configured in accordance with one or more embodiments.

According to various embodiments, both single-dimensional and bi-directional PE arrays are suitable architectures for the Single Instruction Multiple Thread (SIMT) computational model. In this model, each PE executes the same instruction sequence on distinct data residing in its own register file, or in the adjacent register files. In FIG. 6, the global architecture of the signal processor is illustrated. The instruction stream (600), which includes information such as opcodes, addresses, and constants, is parsed and decoded by the Instruction Parser and Decoder block (601). The resulting signals include information such as of addresses, constants, and control signals. The I/O instructions are sent to the I/O controller (604), which controls the data. I/O between the external and the local SIMT memory. The I/O controller generates the memory control signals for both the external memory (603) and the local register file memory that is part of the SIMT array (602). Local memory addresses and control signals for the SIMT array may selectively come from either the I/O controller, or the instruction parser. The selection is accomplished through the multiplexer (605).

External I/O

Global Data Extraction

Figure 7A:
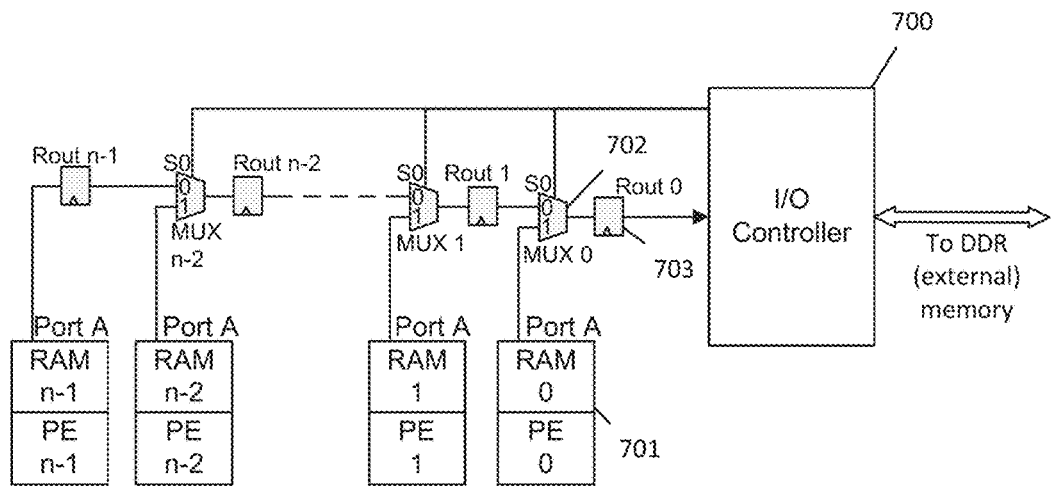
FIGS. 7A and 7B illustrate examples of the external I/O logic of the processing array for global data insertion and extraction, configured in accordance with one or more embodiments.

In some embodiments, the local register files of the PE array must have the capability to exchange data with an external memory. Downloading an original image into the local register files for processing, and uploading the resulted image back into the external memory are two examples of such data exchange operations. FIG. 7A depicts the I/O logic architecture that executes a global data output operation from a ROPE comprising the PEs numbered 0 to n−1. In a global data output operation, all of the PEs in the ROPE will sequentially send their output data to the I/O controller (700). In this embodiment, each of the PEs' local register file RAM block (701) is connected through its local memory port A with a multiplexer (702) followed by a pipeline register (703). When the I/O controller (700) is ready to collect the data from the ROPE, it will switch all multiplexers (702) to input 1, which allows the pipeline registers (703) to load from the PE local register file memory ports A. In the next step, the multiplexers are switched to input 0, which allows the data from each PE to propagate from register to register towards the controller. The presence of the pipeline registers (703) is indicated for two reasons. First, during the n clocks required by the I/O controller to collect all the data from the local register files of the ROPE, the memory ports A will be freed for other access. Secondly, the architecture will be able to support long ROPEs because the data transfer to the controller is pipelined. The I/O controller can service multiple ROPEs concurrently.

Global Data Insertion

Figure 7B:
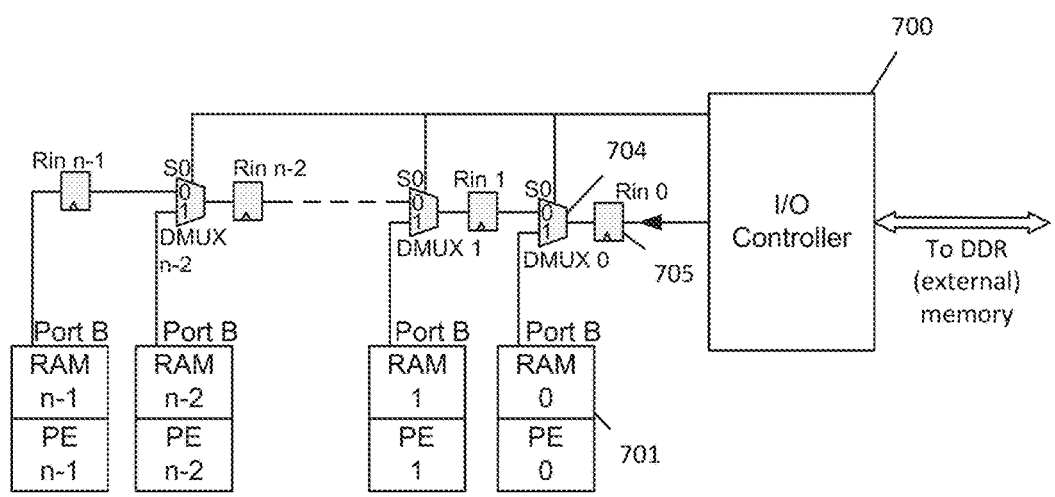

For global data insertion into the local register file memories of a ROPE, a similar pipelined architecture is described in FIG. 7B. In the embodiment shown in FIG. 7B, the multiplexers (702) are replaced with demultiplexers (704). A new set of registers (705) are included in the pipeline. The local register file memory port for data insertion is now Port B. If the local register file memory allows it, the insertion and extraction can be executed concurrently, since they are using separate ports. However, this invention does not require that separate memory ports be used. For global data insertion, the data are being pushed through the pipeline by the I/O controller until all the pipeline registers are loaded. For this step, the demultiplexers are set to output 0. When all the pipeline registers are loaded, the demultiplexers are switched to output 1, which allows the register file memory ports to access the data from the pipeline registers.

Local Data Extraction

In some embodiments, there is a need in some applications for local data extraction and insertion, where only selected PEs exchange one of more pieces of data with the external memory through the I/O controller. An example of such application is a global image minimum. To calculate the minimum pixel in an entire image, all PEs will first determine their respective local minima, which are the minimum pixels from the partitions of the image that are stored in their local register files. Since neighboring PEs can access each other's register files, these local minima may then be propagated to adjacent PEs and pairwise compared against other, adjacent local minima. Following this strategy, after an appropriate number of steps, the global image minimum will be available in only one of the PEs.

Figure 8A:
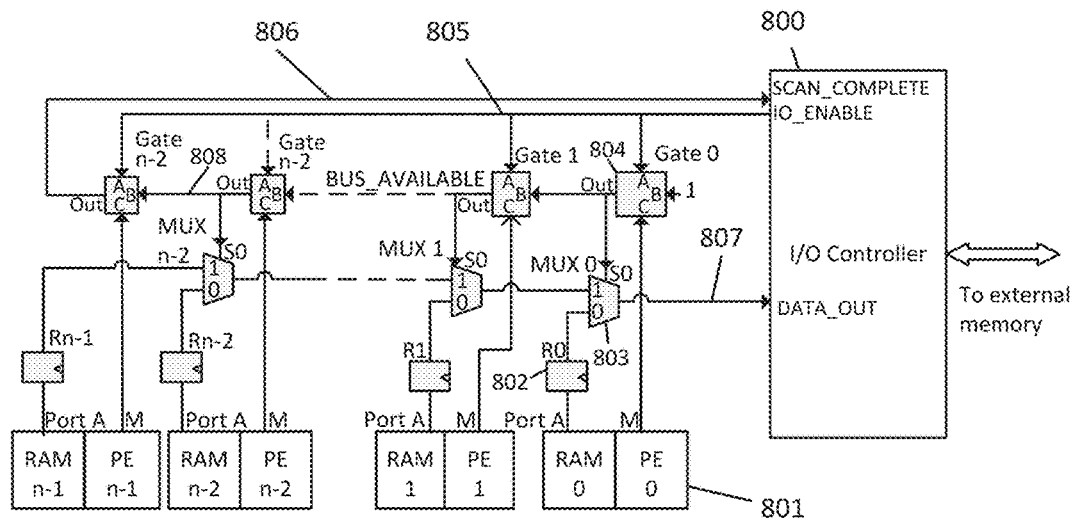
FIGS. 8A and 8B illustrate examples of the external I/O logic of the processing array for local data extraction, configured in accordance with one or more embodiments.

According to various embodiments, in order to retrieve this global minimum, the I/O controller will collect data from all PEs, even though a single piece of datum, from a single PE, is of interest. In FIG. 8A, a pipeline architecture is shown that allows the I/O controller to poll and extract data from either a single, or a set of specific PEs, while bypassing the rest. One advantage of this I/O logic embodiment is that the PEs themselves may signal if their register files have data available for extraction. The I/O controller need not have prior knowledge about the locations of the data to be extracted.

In the embodiment shown in FIG. 8A, the local data extraction operation is accomplished by employing a custom designed "gate" (804), hereupon referred to as the Gate. One embodiment of the Gate is detailed in FIG. 8B.

The local data extraction architecture in the embodiment shown in FIG. 8B functions as follows. When a PE has data available for extraction, it loads it into its output register (or registers) R (802) and raises a logical 1 on its M line. For example, a PE based on a Xilinx DSP core (DSP48E1 or DSP48E2), may employ the PATTERNDETECT output for the M flag. In other devices, the flag M may be a custom 1-bit output, or it may employ the MSB, or any available bit, from the data output. The invention is not limited to these examples. Instead, techniques and mechanisms described herein may be applied to, for example, any implementation where a PE uses an output to signal that it has data available for extraction. In steady state mode, the IO_ENABLE (805) signal is set to 0, and all the Gate circuits all output 1, keeping continuity on the DATA_OUT bus (807). When the I/O controller (800) is ready for data extraction, it will raise the IO_ENABLE line to 1. If PE does not have data available for extraction, its line M will stay on 0, and the element labeled Gate 0 (804) will output 1, maintaining continuity on DATA_OUT bus (807). If, on the other hand, PE0 (801) does have data available for extraction, it will have its M line raised to 1. Consequently, Gate 0 will have logical 1's on all of its inputs, namely A, B and C. This combination of inputs will cause its output to drop to 0, which switches the multiplexer (803) to input 0, thereby allowing the I/O controller access to its output register R0. On the next clock cycle, Gate 1 (the next Gate element in the pipeline) will see its input B raise to 1 and will start a similar process: If the M line is raised in PE 1, then MUX 1 is switched to input 0 and connect the register R1 to the DATA_OUT bus (1307). If, on the other hand, the M line is low, which means that PE 1 does not have data available for extraction, then MUX 1 stays on its input 1, maintaining continuity of the DATA_OUT bus (807).

In some embodiments, the output register (802) may be a plurality of registers which for example might also hold the row and column number of the PE providing the data. The output register may be loaded by the PE or by a discrete row/column position register.

Figure 8B:
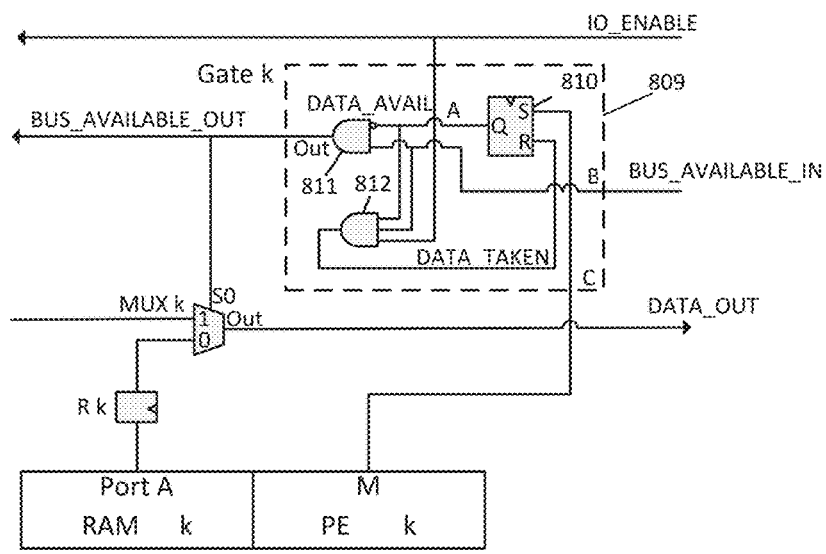

Following this sequence for every PE, the gated data extraction architecture illustrated in FIG. 8B will execute a complete sequential data extraction over the entire ROPE. When the cycle is complete, the output signal from the last Gate device in the ROPE will drop its output to 0 (806), thereby communicating the I/O controller that the cycle has ended (SCAN_COMPLETE) and that all of the available data have been uploaded. At this time, the I/O controller may switch the IO_ENABLE line to 0.

To summarize, the local data extraction architecture shown in FIG. 8A is structured around 4 distinct data and control buses: the DATA_OUT bus (807), the BUS_AVAILABLE line (808), the IO_ENABLE line (805), and the SCAN_COMPLETE line (806). The IO_ENABLE control line signals that the I/O controller is ready for local data extraction. The SCAN_COMPLETE line is an extension of the BUS_AVAILABLE line, which signals back to the I/O controller that the local data extraction cycle has been completed. The DATA_OUT bus spans a number of multiplexers, out of which, only one (for example, MUX k) is switched to 0 at any given moment, allowing access for the I/O controller to the local data register Rk. It is important that all the multiplexers from MUX k−1 to MUX 0, be switched to 1 at this time, in order to ensure the continuity of the DATA_OUT bus, from the I/O controller up to MUX k. Finally, the BUS_AVAILABLE control line goes through the Gate devices and signals to any Gate (for example, Gate k) that the DATA_BUS is available for extracting data from register Rk.

In some embodiments, in order to support the sequence of operations described above, the Gate element implements the following behavior. After a specific Gate (for example, Gate k) has granted access to the I/O controller to its data register (Rk) by dropping its output to 0, it must automatically switch back to 1 in the next clock cycle, in order to restore the continuity of the DATA_OUT bus (807) so that the rest of the ROPE can continue the data extraction process. One embodiment of a circuit designed to support this functionality is the Gate element shown in FIG. 8B. The embodiment from FIG. 8B is not unique, and any alternative circuit that implements the sequential, selective data extraction described above may be employed. The Gate element (809) is enclosed within the hashed rectangle and has three components, namely, a synchronous latch element (810), and two AND gates (811) and (812). When BUS_AVAILABLE_IN, input C (from the M output of the PE) and IO_ENABLE are all on a logical 1, the output of the Gate is changed to 0, thereby switching MUX k to 0. This interrupts the DATA_OUT bus. On the other hand, the output of the internal AND gate (812) is also switched to 1, which, on the next clock, will reset the latch. This will change the output of the Gate to 1, thereby restoring the continuity of the DATA_BUS bus and enabling the next Gate (k+1) to start the process.

Local Data Insertion

In some implementations, a similar circuit may be employed for local data insertion, an operation that is complementary to the local data extraction discussed in the section above. In local data insertion, an individual PE may extract a piece of data from the I/O controller, in order to download a sequence of data into the array in a data dependent manner. The logic for local data insertion may be derived from that presented in FIG. 8A for local data extraction in a similar manner to that used to derive the global data insertion (FIG. 7B) from the global data extraction (FIG. 7A). When resources permit, different memory ports may be available for the data extraction and insertion, in order to allow for concurrent memory read and write operations.

Local and Global Data I/O

Figure 9:
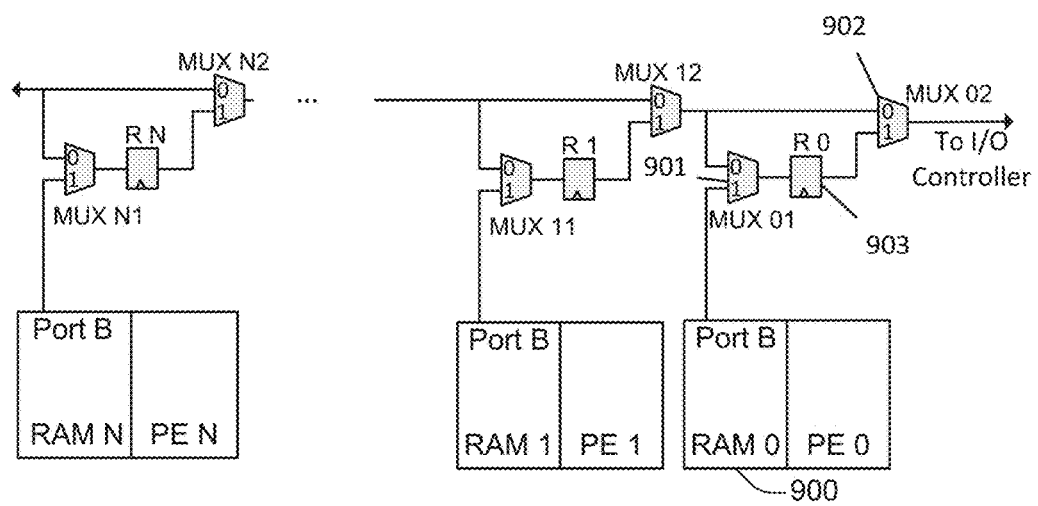
FIG. 9 illustrates an example of an external I/O logic architecture that can support both local and global data exchanges, configured in accordance with one or more embodiments.

According to various embodiments, the I/O logic architectures for global (FIG. 7) and local (FIG. 8) data exchanges may be combined, for instance in order to support both types of operations. The building block of this hybrid I/O logic is shown in FIG. 9, in an embodiment for local and global data extraction. The embodiment shown in FIG. 9 includes a series of data exchanges for data retrieval. For example, the data exchange for RAM 0 (900) includes two multiplexers, MUX 01 (901) and MUX 02 (902), which encapsulate the output data register R0 (903). For global data extraction, MUX 02 (902) is set to output 1, while MUX 01 (901) will switch from 1 to 0. While MUX 01 (901) is on 1, the register R0 is loaded from the local memory.

Then, MUX 01 (901) switches to 0, which allow the data to travel, from register to register, to the I/O controller. For local data extraction, MUX 01 (901) is always set to 1, while MUX 02 (902) will be driven through the Gate element presented in the previous section (not represented in FIG. 9 for the sake of clarity). This pattern of data access continues across RAM 1 through RAM N.

In the embodiments described for global and local data I/O, this invention does not require use of specific register file ports. Port A and B may be assigned differently in various embodiments. Assigning different ports for data input and output maximizes the I/O performance while assigning the same ports maximizes the PE's performance as the second port is always available to the PIE.

Image Data Flow

According to various embodiments, due to its massive parallelism, the SIMT array described herein is particularly suitable for real time video processing, especially for large image formats such as Ultra High Definition (UHD), and 8 k. For the single dimensional array (ROPE) shown in FIG. 4 and the bi-dimensional array shown in FIG. 5, several image data flow patterns are possible. Which data flow pattern is most appropriate depends on factors that may include, but are not limited to: the number of PEs available on the device, the size of the local register files, and the nature of the application.

Figure 10A:
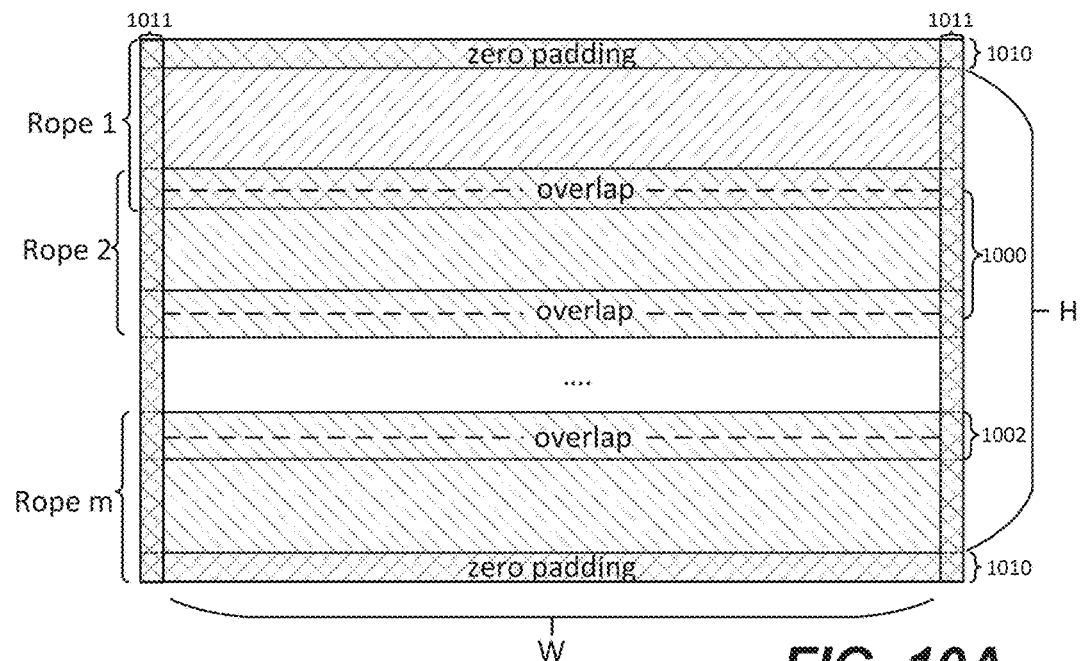
FIGS. 10A, 10B, and 10C illustrate examples of image data flow through the SIMT processor, arranged in accordance with one or more embodiments.

According to various embodiments, FIG. 10A illustrates an example of an image data flow pattern that is suitable to a SIMT array in the shape of a row of pixels (ROPE). Assuming that the ROPE comprises a number of n PEs, and that a total number of m×n PEs are available in the device, each of the m ROPEs can be assigned a band in the image (1000). For an image of W×H pixels, the width of the band of pixels processed by the ROPE will be W pixels and the height of the band of pixels processed by the ROPE will be $$\frac{H + m \times \text{overlap}}{m}.$$

This is also called the tile height, or sub-array height.

Figure 10B:
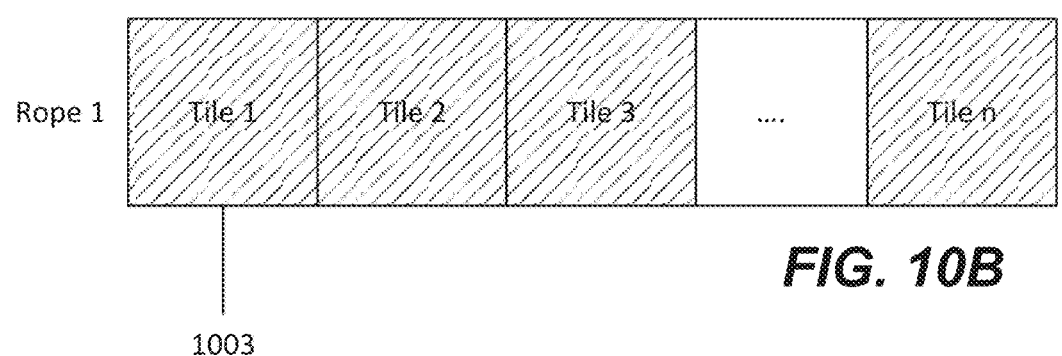

Given an available number of PEs in a device, the number of ROPEs m may be determined by first selecting the horizontal tile size. This concept is represented in FIG. 10B. A tile (1003), or sub-array, is horizontally sized so that all of the pixels required for the largest operator can be stored in the PE's register file or in that if its connected neighbors. The number of PEs per Row n is then the image width W divided by the tile width. Subsequently, the number of ROPEs m is the number of available PE's divided by the number of PE's per row ii. In this example, adjacent tiles do not require overlap because each of the PEs has access to the register files of its neighbors. However, the zero padded regions (1011) along the long edges of the image are still included, even if the lateral PEs are connected to each other through ROPE wraparound (see FIG. 4).

Although adding the second dimension to the ROPE introduces vertical overlap, it may be acceptable in order to increase the processing power of the array with the available resources. According to various embodiments, the overlap (1002) is number of pixels that the adjacent bands will share. The size of the overlap may be determined based on factor such as the topological size of the image operators that are being applied. For example, if a convolutional operator with a size of 5×5 pixels is to be applied, then an overlap of 5−1=4 pixels is necessary in order to avoid edge effects at the seams between the bands. By a similar rationale, the beginning and the end rows of the image is supplemented with vertical zero padded regions (1010) that are half as high as the overlap areas. Horizontal zero paddings (1011) are further required at the left and right edges of the image. The heights of the vertical zero-padded regions and the widths of the horizontal zero-padded regions may be set to half the height of the overlapped regions.

According to various embodiments, zero padding may be substituted by other types of padding including data mirroring, data repeating, etc. Alternately, no padding at all may be specified, with or without data wrapping to the other edge of the array.

Depending on the application, additional storage space may be maintained in the local register file sufficient for performing processing operations. For example, space may be reserved in the local register file sufficient to store the entire number of intermediate images required by the process. Failure to do so will result in less efficient processing since it will require additional data transfers between the local register file and the external memory.

Figure 10C:
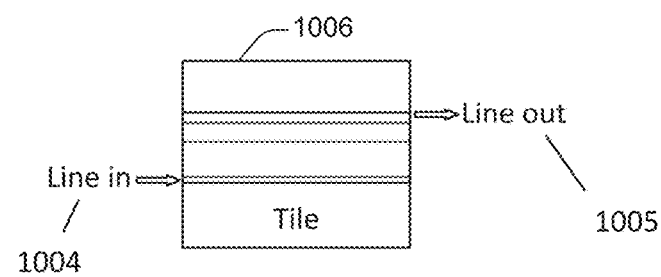

According to various embodiments, if the memory space in the local register file is insufficient to store the desired tile height and the required intermediate images, the data flow may be adjusted to store only fragments of the tile at any given time. This creates a large virtual tile extending tall enough vertically to enable the entire height of the image to be distributed evenly across the number of ROPEs available without requiring the register file to be large enough to hold the entire tile and intermediate images. This concept is represented in FIG. 10C. Starting from the top of the image tile, just enough lines to allow the topologically largest operator to perform are loaded. For example, if this operator is a 5×5 pixel convolution, then 5 lines from the tile are loaded. Convolution is then performed on these 5 lines and a one-line result is produced. The next adjacent image line is then input while the first (oldest) line will be removed. After these steps, the register file will contain the pixels required for the next sequence of convolution operators, producing the next line of the result. Such a configuration is referred to herein as a "Line-in, Line-out" model. For example, FIG. 10C includes tile (1006) with a portion of the lines loaded, as bounded by the line in (1004) and the line out (1005). By enabling the compiler to support symbolic addresses, the register file can be configured as a ring buffer. In the ring buffer, the newest line will physically replace the oldest line, which is discarded. The five lines stored in the register file need not be physically contiguous, but can appear to be with symbolic addressing. In this manner, the remaining lines need not be shifted in the memory in order to maintain their physical order in the image.

Figure 11A:
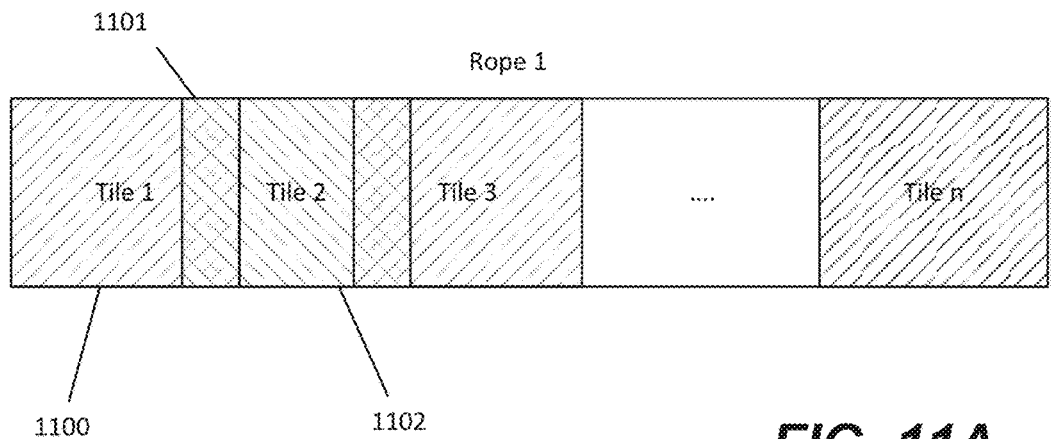
FIGS. 11A and 11B illustrate examples of the concept of overlapped tiles.

FIG. 11A illustrates an embodiment in which image tiles are horizontally overlapped. For example, image tile 1 (1100) includes an overlapping area (1101) that overlaps with image tile 2 (1102). Such a configuration may be desirable for any of various reasons. For example, if the routing resources on the device are limited, then overlapped tiles would alleviate the need to ensure that every PE has access to register files of its adjacent neighbors, increasing the number of PE's possible in the device. Similar to the vertical overlaps described in FIG. 10, the tile overlap may be configured so as to cover at least half of the largest horizontal operator. Another reason to employ horizontal tile overlaps is related to the partitioning of the pixels among the array PEs. When performing image processing, one may allocate a horizontal image band to each ROPE, as described with respect to FIG. 10A. When allocating the number of PEs in a ROPE and the total number of ROPEs on the device, relevant criteria may include, but are not limited to: the size of the image, the size (footprint) of the largest operators, and the total numbers of PEs on the device. Allocating too few PEs per ROPE will result in a large number of ROPEs; if large vertical operators are employed in processing, this allocation is inefficient as the cost of a large vertical overlap will be incurred with every ROPE. Increasing the number of PEs per ROPE such that a very small number of ROPEs are required increases processing efficiency with large vertical operators. The subsequent reduction in tile width can be mitigated by employing horizontal overlap. If the number of PEs per ROPE is too large for the image width, then the tiles will be too small horizontally. Even with East-West neighboring access, the width of the tile may prohibit efficient large horizontal operators.

Figure 11B:
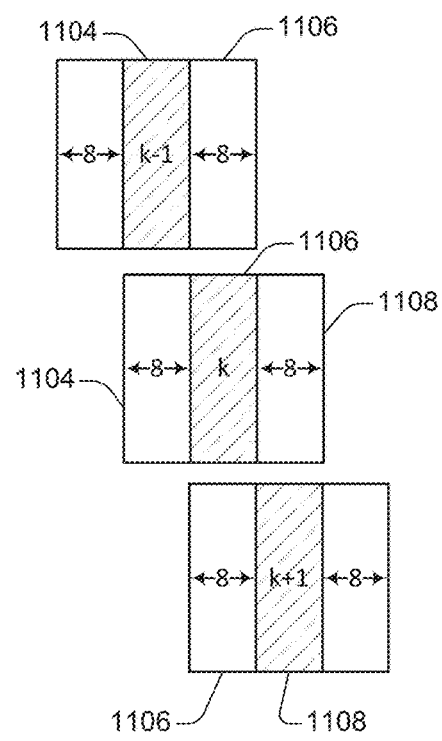

FIG. 11B illustrates an embodiment in which tiles share pixels. For example, the tile number k in FIG. 11B includes pixel blocks (1104), (1106), and (1108). Pixel blocks (1104) and (1106) are shared with tile k−1, while pixel blocks (1106) and (1108) are shared with pixel block k+1. In this example, if each PE processes an 8 pixel wide area in the tile (the hashed region in each tile), a number of 240 PEs per ROPE will be allocated for a 1920 pixel wide image, which is quite reasonable. However, an 8-pixel wide area will only support a 24-pixel wide operator, and only if neighboring access had been implemented. If, on the other hand, the tiles have a 24-pixel width with a 16 pixel overlap on each side, each PE will be able to support a 40-pixel wide operator with neighboring access. Such a configuration may impose an I/O cost associated with traffic between the external memory and the local memory, as many of the same pixels will be transported to multiple destinations (local blocks).

In some implementations, a compiler automatically determines the best PE allocation for a ROPE as well as parameters such as tile sizes and tile overlaps in order to maximize the processing efficiency.

In some instances, there may be no overlap of any kind. For example, the tile size may be selected such that the (tile width×number of PE's) exactly matches the width (or height) of the data and the tile dimensions are selected to enable access to all data required for the largest operation from the local register files or the register files of the accessible neighbors. In this example, only a single ROPE is employed and there is no overlap, allowing processing and I/O to be 100% efficient.

In some embodiments, multiple data channels can be processed concurrently via a SIMT array to take full advantage of the available computing power. These data channels may include external data storage modules such as memory banks, or data streams. In some implementations, more than one image stream can be processed by the array at the same time. For example, a certain equal number of PEs is assigned to each channel. In some embodiments, PEs can be distributed to multiple data streams and allowed to perform distinct operations, concurrently. Such an array is referred to herein as a multiple instruction-multiple data (MIMD) machine and may include multiple instruction sequencers.

Configuration

Figure 13:
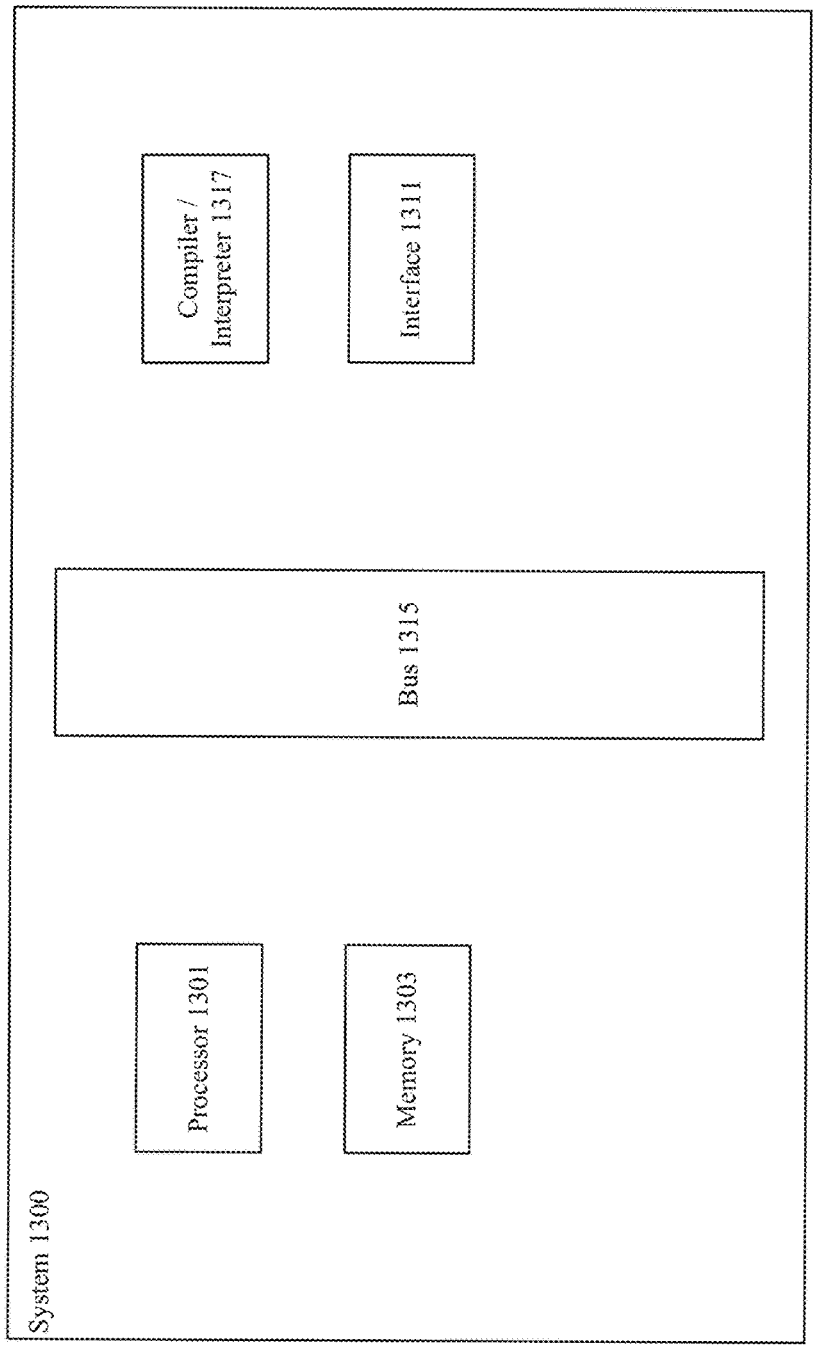
FIG. 13 illustrates an example of a system that may be used in conjunction with techniques and mechanisms described herein.

FIG. 13 illustrates one example of a computing device. According to particular embodiments, a system (1300) suitable for implementing particular embodiments of the present invention includes a processor (1301), a memory (1303), an interface (1311), and a bus (1315) (e.g., a PCI bus or other interconnection fabric).

Particular examples of interfaces supported include baseband interfaces such as SDI, HDMI, DisplayPort, MIPI and the like; and network interfaces such as Ethernet, frame relay, cable, DSL, token ring, and the like. In addition, various very high-speed interfaces may be provided such as Infiniband interfaces, 100 Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control communications-intensive tasks such as packet switching, media control and management.

Techniques and mechanisms described herein may be used to bring ultra-high-performance FPGA development to software developers with little or no experience in RTL and hardware synthesis. In this sense, techniques and mechanisms described herein may affect FPGA based processing in a fashion similar to the one the advent of the Compute Unified Device Architecture (CUDA) platform had on GPU adoption as a general-purpose compute engine.

In some implementations, several layers of software are interposed between the developer and the FPGA device. In order to assist in enabling the signal processor to become a general purpose computational engine, the system may include a high-level language compiler or interpreter, such as the compiler/interpreter (1317) shown in FIG. 13. Programs written for the SIMT engine may be written in C, or Python, or another such language. A set of SIMT intrinsics captures the functionality specific to the SIMT engine and is parsed and interpreted by a library, for example, which translates these intrinsics into machine code instructions. These machine code instructions may be device specific, since an Altera/Intel FPGA device may need a different instruction set than a Xilinx counterpart, and an ASIC implementation may have a fully custom instruction set.

According to various embodiments, each high-level instruction is translated by an instruction parser and decoder. In the translated code, addresses, constants, and control signals required by the DSP slices will be extracted and passed on to an instruction sequencer. The compiler/interpreter (1317) may include an optimization layer, which will detect sequences of instructions that could be optimized. For example, if the computational sequence executed in the DSP slice of the PE requires a pipeline stall, then those cycles may be marked by the optimizer as candidates for concurrent I/O, or I/O instructions that exchange data between the local register files to the external memory.

Global Immediate Data

According to various embodiments, instructions broadcast to a PE array may include immediate data used in the execution of the instructions with which they are included and/or in the execution of instructions sent at a later time. For example, the FPGA may include a global instruction sequencer with a global immediate data lookup table to implement indirect immediate data references within a PE array instruction. In this example, the PE array instruction may include an address that references a value stored in the immediate data lookup table to be used by PEs in execution the instruction and/or later instructions.

In some implementations, the global immediate data lookup table may be written by an external data path to allow one or more external processors to dynamically update the PE array instruction immediate data global indirection value. In this way, feedback of external decisions may be provided to influence the processing done by the PE array. Alternately, or additionally, the table may be updated by the PE array instruction stream.

Multiple Array Configuration

According to various embodiments, techniques and mechanisms described herein may be used in conjunction with multiple array processors (MAPs). MAPs may be arranged in any of various ways. For example, each MAP may process a separate channel (i.e. stream) of data. As another example, each MAP may operate on a distinct segment of an image. As yet another example, MAP processors often have a long edge and a short edge. In this case, two or more MAP processors may be arranged such that they are adjacent along the short edge.

In some implementations, flexible signal instruction streams may feed one or more MAPs that are configured to process different data streams. Indirection may be used to allow different global constants per stream for applications such as compression quantization.

In particular embodiments, an FPGA may include one or more MAPs. Alternately, or additionally, an ASIC may include one or more MAPs. In some configurations, MAPs may receive instructions from multiple instruction sequencers.

CONCLUSION

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

The invention claimed is:

1. A data processing system comprising:
a plurality of processing elements, each processing element including a respective internal hardened field-programmable gate array digital signal processor, each processing element further including an internal hardened field-programmable gate array memory element;
a plurality of connections between the processing elements, wherein each digital signal processor can directly access the internal hardened field-programmable gate array memory element of at least one other digital signal processor; and
an input/output subsystem configured to write input data to the respective internal hardened field-programmable gate array memory element associated with each processing element, wherein the processing elements are arranged in a grid having a first dimension and a second dimension, wherein a length of the grid along the second dimension is greater than a length of the grid along the first dimension, wherein the processing elements are configured to receive the input data along the length of the second dimension.

2. The data processing system recited in claim 1, wherein each of the processing elements is configured to execute one or more instructions received from a designated source, the execution of the one or more instructions based on an internal state associated with the processing element.

3. The data processing system recited in claim 1, wherein the plurality of processing elements is arranged in a one-dimensional or two-dimensional grid such that each processing element is contiguous with one or more other processing elements, wherein each processing element can directly access the internal hardened field-programmable gate array memory element of associated contiguous processing elements in a single clock cycle.

4. The data processing system recited in claim 1, wherein the data processing system is configured to process input data arranged in an array, and wherein each processing element is configured to receive a respective sub-array of the input data.

5. The data processing system recited in claim 1, wherein the input data is written as a ring buffer.

6. The data processing system recited in claim 5, wherein the data processing system is configured to process input data arranged in an array, wherein each processing element is configured to receive a respective sub-array of the input data, each sub-array having a first sub-dimension length and a second sub-dimension length, wherein the sub-dimension lengths are selected such that a height of the array is one processing element.

7. The data processing system recited in claim 1, wherein the processing elements are arranged in a grid having a first dimension and a second dimension, and wherein a length of the grid along the second dimension is greater than a length of the grid along the first dimension, wherein the data processing system is configured to process input data arranged in an array, wherein each processing element is configured to receive a respective sub-array of the input data, and wherein the processing elements are arranged so as to substantially eliminate redundancy in processing data along the second dimension.

8. The data processing system recited in claim 1, the data processing system further comprising:
an input/output subsystem configured to write input data to the respective internal hardened field-programmable gate array memory element associated with each processing elements, wherein the processing elements are arranged in a grid having a first dimension and a second dimension, wherein a length of the grid along the second dimension is greater than a length of the grid along the first dimension, wherein the processing elements are configured to receive the input data along the length of the second dimension, wherein the input data is written as a ring buffer, and wherein the processing elements are arranged so as to substantially eliminate redundancy in processing data along the first dimension.

9. The data processing system recited in claim 1, wherein each of the processing elements is configured to execute one or more instructions received from a designated source, a first one of the instructions including a memory address that references a value stored in an immediate data lookup table located external to the processing element.

10. The data processing system recited in claim 1, the processing elements being configured to process input data to produce a result and store the result in an output bus, the result being normalized by extracting a contiguous subset of the bits from the output bus.

11. A data processing system comprising:
a plurality of processing elements, each processing element including a respective internal application-specific integrated circuit digital signal processor, each processing element further including an application-specific integrated circuit memory element;
a plurality of connections between the processing elements, wherein each digital signal processor can directly access the application-specific integrated circuit memory element of at least one other digital signal processor; and an input/output subsystem configured to write input data to the respective application-specific integrated circuit memory element associated with each processing element, wherein the processing elements are arranged in a grid having a first dimension and a second dimension, wherein a length of the grid along the second dimension is greater than a length of the grid along the first dimension, wherein the processing elements are configured to receive the input data along the length of the second dimension.

12. The data processing system recited in claim 11, wherein each of the processing elements is configured to execute one or more instructions received from a designated source, the execution of the one or more instructions based on an internal state associated with the processing element.

13. The data processing system recited in claim 11, wherein the plurality of processing elements is arranged in a one-dimensional or two-dimensional grid such that each processing element is contiguous with one or more other processing elements, wherein each processing element can directly access the application-specific integrated circuit memory element of associated contiguous processing elements in a single clock cycle.

14. The data processing system recited in claim 11, wherein the data processing system is configured to process input data arranged in an array, and wherein each processing element is configured to receive a respective sub-array of the input data.

15. The data processing system recited in claim 11, wherein the input data is written as a ring buffer.

16. The data processing system recited in claim 15, wherein the data processing system is configured to process input data arranged in an array, wherein each processing element is configured to receive a respective sub-array of the input data, each sub-array having a first sub-dimension length and a second sub-dimension length, wherein the sub-dimension lengths are selected such that a height of the array is one processing element.

17. The data processing system recited in claim 11, wherein the processing elements are arranged in a grid having a first dimension and a second dimension, and wherein a length of the grid along the second dimension is greater than a length of the grid along the first dimension, wherein the data processing system is configured to process input data arranged in an array, wherein each processing element is configured to receive a respective sub-array of the input data, and wherein the processing elements are arranged so as to substantially eliminate redundancy in processing data along the second dimension.

18. The data processing system recited in claim 11, the data processing system further comprising:

an input/output subsystem configured to write input data to the respective application-specific integrated circuit memory element associated with each processing elements, wherein the processing elements are arranged in a grid having a first dimension and a second dimension, wherein a length of the grid along the second dimension is greater than a length of the grid along the first dimension, wherein the processing elements are configured to receive the input data along the length of the second dimension, wherein the input data is written as a ring buffer, and wherein the processing elements are arranged so as to substantially eliminate redundancy in processing data along the first dimension.

19. The data processing system recited in claim 11, wherein each of the processing elements is configured to execute one or more instructions received from a designated source, a designated one of the instructions including a memory address that references a value stored in an immediate data lookup table located external to the processing element.

20. The data processing system recited in claim 11, the processing elements being configured to process input data to produce a result and store the result in an output bus, the result being normalized by extracting a contiguous subset of the bits from the output bus.

* * * * *